(12) United States Patent
Kobayashi et al.

(10) Patent No.: US 7,449,971 B2
(45) Date of Patent: Nov. 11, 2008

(54) TRANSISTOR OSCILLATING CIRCUIT HAVING LOW CHANGE IN OSCILLATING FREQUENCY DUE TO CHANGE IN POWER SUPPLY VOLTAGE

(75) Inventors: Hiroki Kobayashi, Fukushima-ken (JP); Masaki Tagai, Fukushima-ken (JP); Ryutaro Makita, Saitama-ken (JP); Toru Kozu, Kanagawa-ken (JP)

(73) Assignee: ALPS Electric Co., Ltd., Tokyo (JP)

( * ) Notice: Subject to any disclaimer, the term of this patent is extended or adjusted under 35 U.S.C. 154(b) by 63 days.

(21) Appl. No.: 11/449,061

(22) Filed: Jun. 7, 2006

(65) Prior Publication Data

US 2006/0279369 A1    Dec. 14, 2006

(30) Foreign Application Priority Data

Jun. 10, 2005    (JP) .............................. 2005-171272

(51) Int. Cl.
*H03B 1/00* (2006.01)
(52) U.S. Cl. ............... 331/177 V; 331/167; 331/117 R; 331/36 C
(58) Field of Classification Search ............. 331/117 R, 331/167, 177 V, 36 C, 117 FE
See application file for complete search history.

(56) References Cited

U.S. PATENT DOCUMENTS

| 4,721,927 A | 1/1988 | Aota et al. .................. 332/130 |
| 6,294,961 B1* | 9/2001 | Baba ........................... 331/49 |
| 7,180,382 B2* | 2/2007 | Mohan et al. ........... 331/116 R |

FOREIGN PATENT DOCUMENTS

JP    08-213904    8/1996

* cited by examiner

*Primary Examiner*—Arnold Kinkead
(74) *Attorney, Agent, or Firm*—Beyer Law Group LLP

(57) ABSTRACT

Provided is a transistor oscillating circuit capable of reducing change in oscillating frequency due to change in power supply voltage by improving a base bias circuit of an oscillating transistor 3.

In a transistor oscillating circuit, an oscillating circuit 3 of which an emitter is connected to ground through an emitter load resistor 8, a resonance circuit 2 is connected between a base and the ground, and a collector is connected to a power supply terminal, is included, base bias resistors 9 and 10 are connected between the base and the collector and between the base and the emitter of the oscillating transistor 3, and a capacitor 7 is connected between the emitter of the oscillating transistor 3 and AC-ground.

7 Claims, 2 Drawing Sheets

TRANSISTOR OSCILLATING CIRCUIT HAVING LOW CHANGE IN OSCILLATING FREQUENCY DUE TO CHANGE IN POWER SUPPLY VOLTAGE

BACKGROUND OF THE INVENTION

1. Field of the Invention

The present invention relates to a transistor oscillating circuit having a circuit structure capable of reducing change in oscillating frequency due to change in power supply voltage.

2. Description of the Related Art

Conventionally, as a Colpitts transistor oscillating circuit for generating a radio frequency signal, a transistor oscillating circuit shown in FIG. 2 is known.

As shown in FIG. 2, the transistor oscillating circuit includes an oscillating circuit unit 21 having a resonance circuit connection node 21a, an oscillating signal output node 21b, and a power supply connection node 21c, and a resonance circuit 22 having an output node 22a and a control node 22b. In this case, the oscillating circuit unit 21 includes an oscillating transistor 23, coupling capacitors 24 and 25, feedback capacitors 26 and 27, an emitter load resistor 28, base bias resistors 29 and 30, and a bypass capacitor 31. The resonance circuit 22 includes $\lambda/4$ dielectric resonator 32, a varactor diode 33, a DC blocking capacitor 34, and a buffer inductor 35.

In addition, in the oscillating circuit unit 21, an emitter of the oscillating transistor 23 is connected to ground through the emitter load resistor 28, to the oscillating signal output node 21b through the coupling capacitor 25, to a base thereof through the feedback capacitor 26, and to a collector thereof through the feedback capacitor 27. The base of the oscillating transistor 23 is connected to the resonance circuit connection node 21a through the coupling capacitor 24, to a collector thereof through the base bias resistor 29, and to the ground through the base bias resistor 30. The collector of the oscillating transistor 23 is directly connected to the power supply connection node 21c and to the ground through the bypass capacitor 31. In this case, the resonance circuit connection node 21a is connected to the output node 22a of the resonance circuit 22, the oscillating signal output node 21b is connected to a next-stage buff amplifier (not shown), and the power supply connection node 21c is connected to a power supply terminal (no reference numeral) for receiving a power supply voltage Vcc.

In addition, in the resonance circuit 22, one end of the $\lambda/4$ dielectric resonator 32 is connected to the output node 22a and the other end thereof is connected to the ground. An anode of the varactor diode 33 is connected to the ground and a cathode thereof is connected to the output node 22a through the DC blocking capacitor 34 and to the control node 22b through the buffer inductor 35. In this case, the control node 22b is connected to a control terminal Vf for receiving a frequency control voltage.

The oscillating circuit unit 21 having the above-described structure is a Colpitts transistor oscillating circuit, in which an oscillating frequency is set by the feedback capacitors 26 and 27 connected between the base and the emitter of the oscillating transistor 23 and the resonance circuit 22 RF-connected between the base and the collector, and the oscillating signal output from the emitter of the oscillating transistor 23 is supplied to the oscillating signal output node 21b through the coupling capacitor 25.

In the conventional transistor oscillating circuit, the base bias resistors 29 and 30 of the oscillating transistor 23 are connected between the power supply connection node 21c and the ground in series and a divided voltage, which is generated in a connection point thereof, is supplied to the base of the oscillating transistor 23 as the base bias voltage Vb. In this case, when resistance values of the base bias resistors 29 and 30 are R1 and R2, respectively, a current amplifying ratio of the oscillating transistor 23 is sufficiently large, and the base current can be ignored, the base bias voltage Vb is set by $Vb=Vcc\times\{R2/(R1+R2)\}$.

At this time, when a voltage between the collector and the base of the oscillating transistor 23 is Vcb, a voltage between the collector and the emitter thereof is Vce, and a junction voltage between the base and the emitter is 0.7 V, the base bias voltage is set by $Vcb=Vcc-Vb=Vcc\times\{R1/(R1+R2)\}$ $Vce=Vcb+0.7=Vcc\times\{R1/(R1+R2)\}+0.7$ As can be seen from above equations, when the power supply voltage Vcc is changed, the voltage Vcb between the collector and the base and the voltage Vce between the collector and the emitter of the oscillating transistor 23 are changed in correspondence with change in power supply voltage Vcc, an internal capacitance between the collector and the base and an internal capacitance between the collector and the emitter of the oscillating transistor 23 are changed depending on the above-described change, and the oscillating frequency of the oscillating transistor 23 is significantly changed.

SUMMARY OF THE INVENTION

The present invention is to consider the above-described background art, and it is an object of the present invention to provide a transistor oscillating circuit capable of reducing change in oscillating frequency due to change in power supply voltage by improving a base bias circuit of an oscillating transistor.

In order to achieve the object, there is provided a transistor oscillating circuit, wherein an oscillating transistor, of which an emitter is connected to ground through an emitter load resistor, a resonance circuit is connected between a base and the ground, and a collector is connected to a power supply terminal, is included and base bias resistors are connected between the base and the collector and between the base and the emitter of the oscillating transistor.

According to claim 1 of the present invention, a circuit in which base bias resistors are connected between the collector (power supply terminal) and the base and between the base and the emitter of the oscillating transistor is used as an oscillating transistor base bias circuit which is operated in a collector ground manner. Accordingly, in comparison with the circuit with a general base bias circuit in which base bias resistors are connected between the collector (power supply terminal) and the base and between the base and the ground, the change in the voltage Vcb between the collector and the base and the change in voltage Vce between the collector and the emitter due to the change in power supply voltage are reduced, and thus the change in internal capacitance between the collector and the base and the change in internal capacitance between the collector and the emitter are suppressed. Accordingly, the change in oscillating frequency can be reduced although the power supply voltage is changed.

In addition, according to claim 2 of the present invention, since the collector of the oscillating transistor is RF-connected to the ground, it is possible to configure a collector ground type oscillating circuit having low change in oscillating frequency due to change in power supply voltage.

In addition, according to claim 3 of the present invention, since a varactor diode of which an anode is DC-connected is provided in the resonance circuit and a control voltage is applied to a cathode of the varactor diode, it is possible to configure a voltage controlled oscillating circuit having low change in oscillating frequency due to change in power supply voltage.

DESCRIPTION OF THE PREFERRED EMBODIMENT

Hereinafter, an embodiment of the present invention will be described with reference to the attached drawings.

Figure 1:
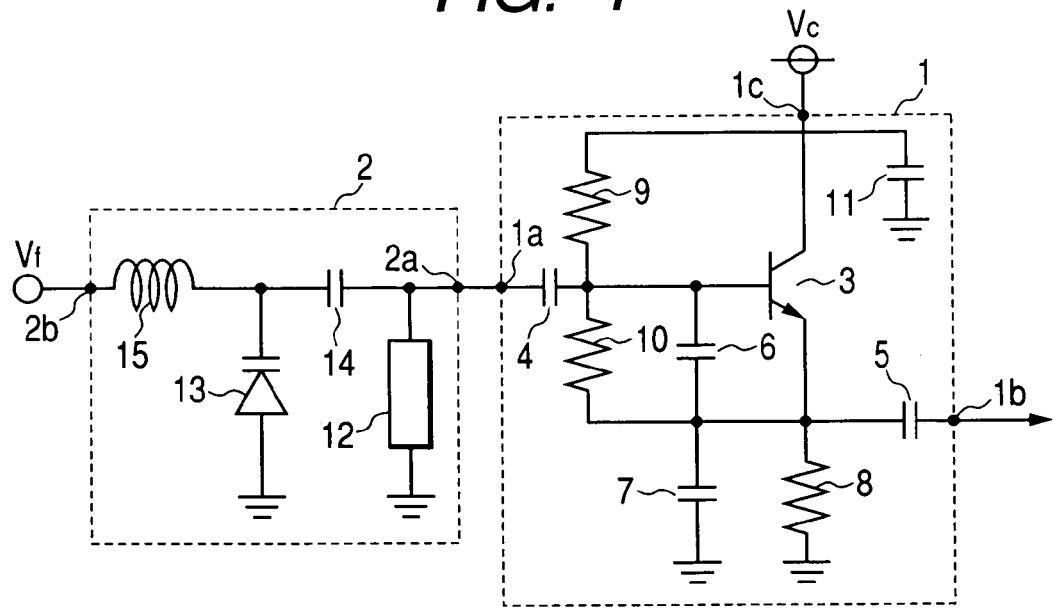
FIG. 1 is a circuit diagram showing a circuit structure of a transistor oscillating circuit according to an embodiment of the present invention.
Figure 2:
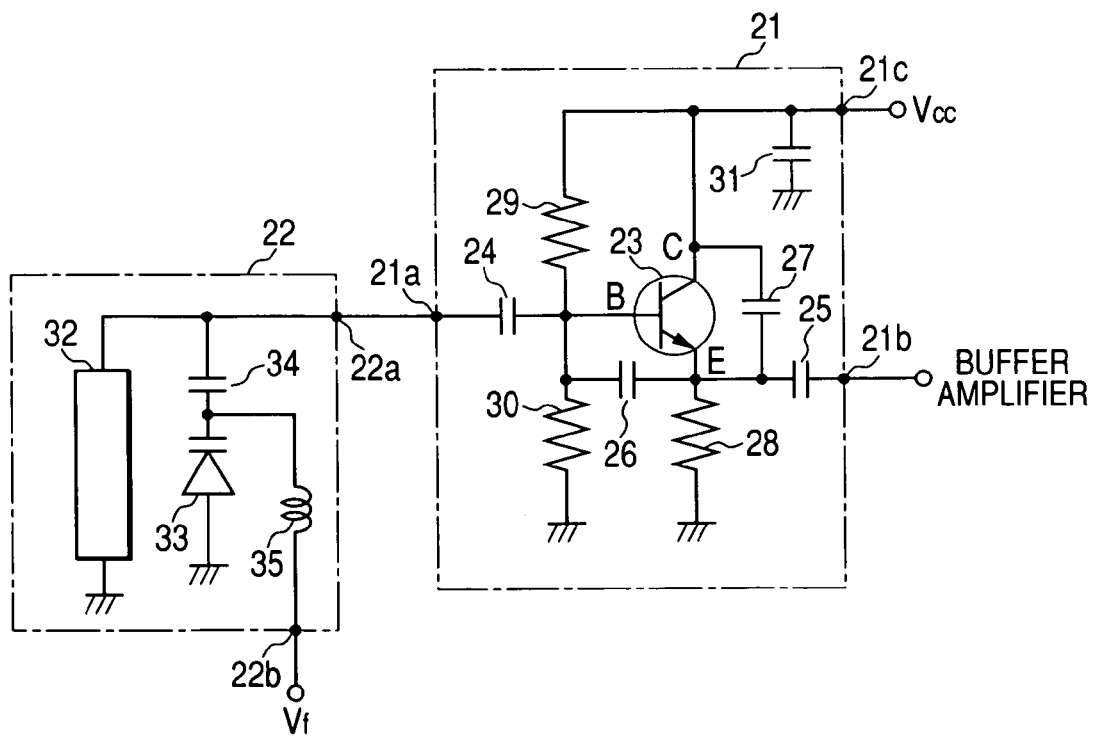
FIG. 2 is a circuit diagram showing a conventional transistor oscillating circuit.

FIG. 1 is a circuit diagram showing a circuit structure of a transistor oscillating circuit according to an embodiment of the present invention.

As shown in FIG. 1, the transistor oscillating circuit according to the present embodiment includes an oscillating circuit unit 1 having a resonance circuit connection node 1a, an oscillating signal output node 1b, and a power supply connection node 1c, and a resonance circuit 2 having a connection node 2a and a control node 2b. In this case, the oscillating circuit unit 1 includes an oscillating transistor 3, coupling capacitors 4 and 5, feedback capacitors 6 and 7, an emitter load resistor 8, base bias resistors 9 and 10, and a bypass capacitor 11. The resonance circuit 22 includes a resonance inductor element 12, a varactor diode 13, a DC blocking capacitor 14, and a choke inductor 15.

In addition, in the oscillating circuit unit 1, an emitter of the oscillating transistor 3 is connected to ground through the emitter load resistor 8, to the oscillating signal output node 1b through the coupling capacitor 5, to a base thereof through the feedback capacitor 6, and to ground (AC ground) through the feedback capacitor 7. The base of the oscillating transistor 3 is connected to the resonance circuit connection node 1a through the coupling capacitor 4, to a collector thereof through the base bias resistor 9, and to the emitter thereof through the base bias resistor 10. The collector of the oscillating transistor 3 is directly connected to the power supply connection node 1c and to the ground (AC ground) through the bypass capacitor 11. In this case, the resonance circuit connection node 1a is connected to the connection node 2a of the resonance circuit 2, the oscillating signal output node 1b is connected to a next-stage buff amplifier (not shown), and the power supply connection node 1c is connected to a power supply terminal (no reference numeral) for receiving a power supply voltage Vcc.

In addition, in the resonance circuit 2, one end of the resonance inductor element 12 is connected to the connection node 2a and the other end thereof is connected to the ground. An anode of the varactor diode 13 is connected to the ground and a cathode thereof is connected to the connection node 2a through the DC blocking capacitor 14 and to the control node 2b through the choke inductor 15. In this case, the control node 2b is connected to a control terminal (no reference numeral) for receiving a frequency control voltage Vf.

The oscillating circuit unit having the above-described structure is a Colpitts transistor oscillating circuit, which is configured by the feedback capacitors 6 and 7, which are connected between the base and the emitter and between the emitter and the collector (AC ground) of the oscillating transistor 3, respectively, and the resonance circuit 2 connected between the base and the collector (AC ground). In addition, an oscillating frequency of the transistor oscillating circuit is mainly set by a parallel resonance frequency of the feedback capacitors 6 and 7 and the resonance circuit 2. The oscillating frequency is controlled by the frequency control voltage Vf applied to the varactor diode 13 which is connected to the resonance inductor element 12 in parallel. An oscillating signal is output from the emitter of the oscillating transistor 3 and supplied to the oscillating signal output node 1b through the coupling capacitor 5.

In the transistor oscillating circuit according to the present embodiment, a state of a bias voltage generated between electrodes of the oscillating transistor 3 will be considered.

In the transistor oscillating circuit, the base bias resistors 9 and 10 of the oscillating transistor 3 are connected between the power supply node 1c (collector of the oscillating transistor 3) and the emitter of the oscillating transistor 3 in series, and a divided voltage, which is generated in a connection point between the resistors 9 and 10, is supplied to the base of the oscillating transistor 3 as a base bias voltage Vb.

In this case, in the power supply voltage applied to the power supply connection node 1c, when a collector voltage of the oscillating transistor 3 is Vc, a base voltage thereof is Vb, an emitter voltage thereof is Ve, resistance values of the base bias resistors 9 and 10 are R1 and R2, a current amplifying ratio of the oscillating transistor 3 is sufficiently large, and base current can be ignored, that is, current flowing in the base bias resistor 9 and current flowing in the base bias resistor 10 are equal to each other and a junction voltage between the base and the emitter of the oscillating transistor 3 is 0.7 V, following equations are satisfied.

$$(Vc-Vb)/R1=(Vb-Ve)/R2 \tag{1}$$

From the above-described condition, since Ve=Vb−0.7 and Vb−Ve=0.7, Equation 1 is rewritten by $$(Vc-Vb)/R1=(Vb-Ve)/R2=0.7/R2 \tag{2}.$$

From Equation 2, it can be seen that a voltage Vcb(=Vc−Vb) between the collector and the base is expressed by $$Vcb=0.7\times(R1/R2) \tag{3}$$

and does not depend on the power supply voltage Vc. In addition, it can be seen that a voltage between the collector and the emitter is expressed by $$Vce=0.7\times(R1/R2)+0.7 \tag{4}$$

and does not depend on the power supply voltage.

In an actual circuit, since a value of the base current of the oscillating transistor 3 cannot be completely ignored and the collector current (=emitter current) is also changed depending on change in power supply voltage Vc, the voltages Vcb and Vce may slightly depend on the power supply voltage Vc. In this case, when the resistance values R1 and R2 of the base bias resistors 9 and 10 are small and the current amplifying ratio of the oscillating transistor 3 is large, the base current can be ignored and thus dependency of the voltage Vcb between the collector and the base and the voltage Vce between the collector and the emitter on the power supply voltage Vc is reduced.

Figure 3:
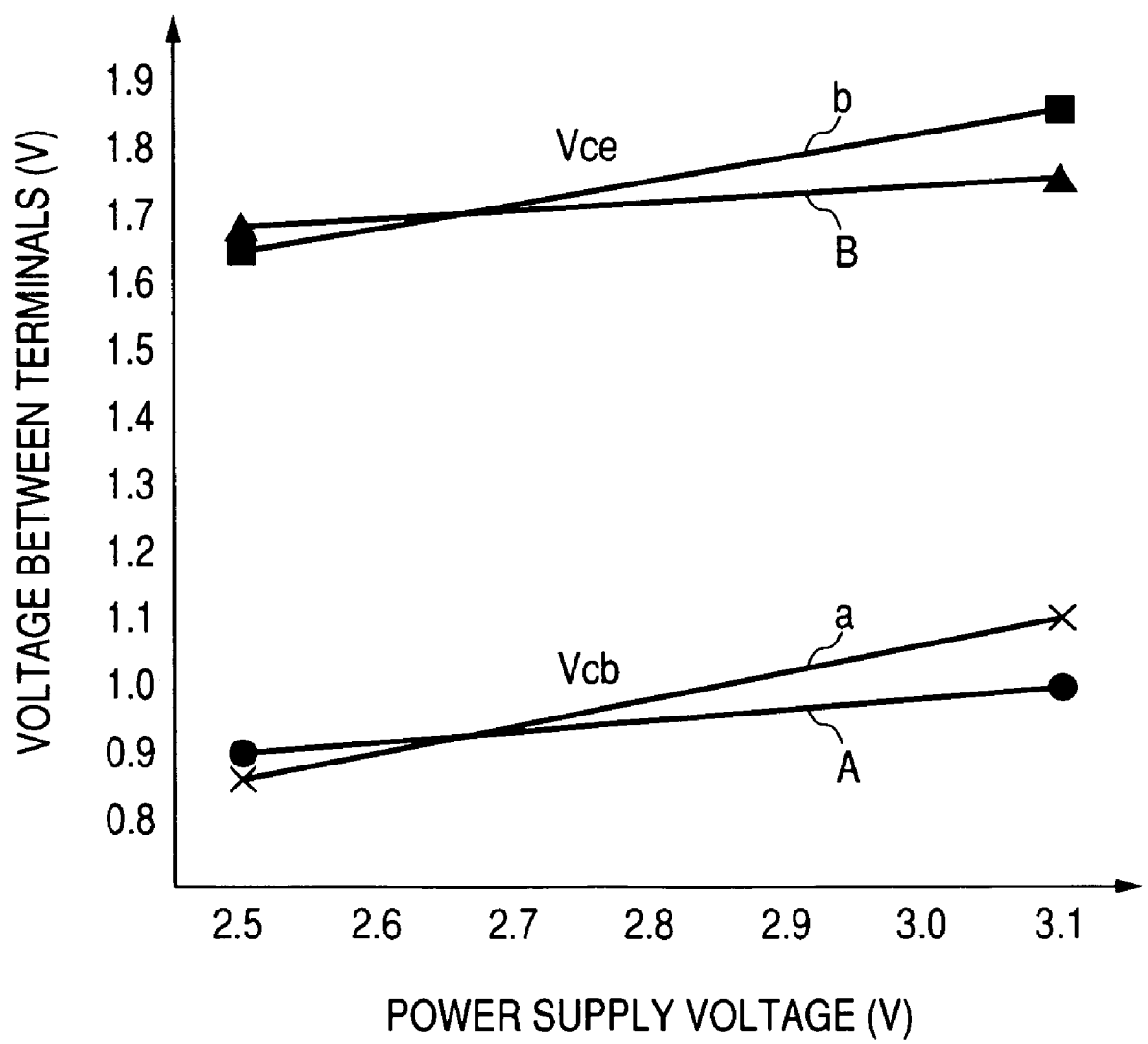
FIG. 3 is a characteristic graph showing a state that a voltage between a collector and a base and a voltage between the collector and an emitter of an oscillating transistor is changed depending on change in power supply voltage Vc.

FIG. 3 is a characteristic graph showing a state that the voltage Vcb between the collector and the base and the voltage Vce between the collector and the emitter of the oscillating transistor 3 are changed depending on the change in power supply voltage Vc. In this case, a characteristic curve A represents the change in voltage Vcb between the collector and the base of the transistor oscillating circuit according to the present embodiment and a characteristic curve B represents the change in voltage Vce between the collector and the emitter of the transistor oscillating circuit according to the present embodiment. Meanwhile, a characteristic curve a represents the change in voltage Vcb between the collector and the base of the conventional transistor oscillating circuit and a characteristic curve b represents the change in voltage Vce between the collector and the emitter of the conventional transistor oscillating circuit.

In the characteristic graph shown in FIG. 3, the transistor oscillating circuit according to the present embodiment has the characteristic curves A and B when the resistance value R1 of the base bias resistor 9 is 2 kΩ, the resistance value R2 of the base bias resistor 10 is 2.2 kΩ, and a resistance value of the emitter load resistor 8 is 62 Ω. In addition, the conventional transistor oscillating circuit has the characteristic curves a and b when the resistance value R1 of the base bias resistor 29 is 1.1 kΩ, the resistance value R2 of the base bias resistor 30 is 2.35 kΩ, and a resistance value of the emitter load resistor 28 is 62 Ω.

As shown by the characteristic curves A and a and the characteristic curves B and b of FIG. 3, when comparing the transistor oscillating circuit according to the present embodiment and the conventional transistor oscillating circuit, since the change in the voltage Vcb between the collector and the base and the change in voltage Vce between the collector and the emitter due to the change in power supply voltage Vc are reduced in the transistor oscillating circuit according to the present embodiment, the change in internal capacitance between the collector and the base and the change in internal capacitance between the collector and the emitter are reduced in the transistor oscillating circuit according to the present embodiment. Accordingly, the change in oscillating frequency due to the change in power supply voltage is significantly reduced in comparison with the conventional transistor oscillating circuit and thus the transistor oscillating circuit for performing a stable operation can be realized.

What is claimed is:

1. A transistor oscillating circuit having a reduced oscillating frequency dependency upon power supply voltage changes, comprising:
   an oscillating transistor having an emitter, a collector, and a base, the emitter coupled to ground through an emitter load resistor, the collector connected to a power supply terminal, the base coupled to the collector through a first bias resistor and to the emitter through a second bias resistor;
   a resonance circuit coupled with the base of the oscillating transistor, wherein the first bias resistor, the second bias resistor, and the emitter load resistor are directly connected in series between the power supply terminal and the ground;
   a first feedback capacitor coupled from the base of the oscillating transistor to a connection point between the second bias resistor and the emitter load resistor; and
   a second feedback capacitor coupled from the connection point between the second bias resistor and the emitter load resistor to the ground.

2. The transistor oscillating circuit according to claim 1, wherein the collector of the oscillating transistor is RF-connected to the ground.

3. The transistor oscillating circuit according to claim 1, wherein a varactor diode of which an anode is DC-connected is provided in the resonance circuit and a control voltage is applied to a cathode of the varactor diode.

4. The transistor oscillating circuit according to claim 1, wherein a divided voltage generated at a connection point between the first bias resistor and the second bias resistor is applied to the base of the oscillating transistor as a base bias voltage.

5. The transistor oscillating circuit according to claim 1, wherein the resonance circuit is couple to the base of the oscillating transistor through a coupling capacitor.

6. The transistor oscillating circuit according to claim 1, wherein the collector of the oscillating transistor is connected to the ground though a coupling capacitor.

7. The transistor oscillating circuit according to claim 1, wherein the resonance circuit includes:
   a varactor diode having an anode and a cathode, the anode being connected to the ground, the cathode receiving a control voltage.

* * * * *